United States Patent
Chen et al.

(10) Patent No.: US 7,532,065 B2
(45) Date of Patent: May 12, 2009

(54) ANALOG AMPLIFIER HAVING DC OFFSET CANCELLATION CIRCUIT AND METHOD OF OFFSET CANCELLATION FOR ANALOG AMPLIFIERS

(75) Inventors: Jinghong Chen, Basking Ridge, NJ (US); Gregory W. Sheets, Breinigsville, PA (US); Joseph Anidjar, Asbury, NJ (US); Robert J. Kapuschinsky, Hazleton, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 143 days.

(21) Appl. No.: 11/420,177

(22) Filed: May 24, 2006

(65) Prior Publication Data

US 2007/0013440 A1  Jan. 18, 2007

Related U.S. Application Data

(60) Provisional application No. 60/698,375, filed on Jul. 12, 2005.

(51) Int. Cl.
*H03F 1/02* (2006.01)
(52) U.S. Cl. ........................................... 330/9
(58) Field of Classification Search ............... 330/9; 327/124, 307
See application file for complete search history.

(56) References Cited

U.S. PATENT DOCUMENTS

| | | | |
|---|---|---|---|
| 5,295,161 A * | 3/1994 | Dreps et al. | 375/318 |
| 5,432,475 A * | 7/1995 | Fukahori | 330/254 |
| 5,798,664 A * | 8/1998 | Nagahori et al. | 327/307 |
| 6,433,612 B1 | 8/2002 | Jenkins | |
| 6,489,811 B2 | 12/2002 | Jenkins | |
| 6,674,328 B2 * | 1/2004 | Uto et al. | 330/259 |
| 6,686,787 B2 | 2/2004 | Ling | |
| 6,710,645 B2 * | 3/2004 | Isken et al. | 330/9 |
| 6,777,988 B2 | 8/2004 | Tung et al. | |
| 6,825,707 B2 | 11/2004 | Viehmann et al. | |
| 6,897,700 B1 | 5/2005 | Fu et al. | |
| 6,903,593 B2 | 6/2005 | Wang | |
| 6,937,083 B2 | 8/2005 | Manlove et al. | |

(Continued)

FOREIGN PATENT DOCUMENTS

JP   07240640 A  * 9/1995

OTHER PUBLICATIONS

Peter R. Kinget, "Device Mismatch and Tradeoffs in the Design of Analog Circuits," IEEE Journal of Solid-State Circuits, vol. 40, No. 6, Jun. 2005, pp. 1212-1224.

(Continued)

*Primary Examiner*—Robert Pascal
*Assistant Examiner*—Khiem D Nguyen
(74) *Attorney, Agent, or Firm*—Mendelsohn & Assoc., P.C.; Kevin M. Drucker; Steve Mendelsohn

(57) ABSTRACT

An amplifier having DC offset compensation includes at least one input node and a pair of differential output nodes, a biasing circuit coupled to the input node; and a plurality of current sources. Selected ones of said current sources are coupled to the input node to adjust a DC voltage at the input node to provide DC offset compensation for the amplifier

14 Claims, 5 Drawing Sheets

U.S. PATENT DOCUMENTS

| | | | |
|---|---|---|---|
| 6,968,172 | B2 | 11/2005 | Saito |
| 7,154,294 | B2 | 12/2006 | Liu et al. |
| 7,259,616 | B2 * | 8/2007 | Chang ..................... 330/9 |
| 7,271,649 | B2 * | 9/2007 | Chiu et al. ................. 330/9 |
| 2003/0141912 | A1 | 7/2003 | Sudjian |
| 2004/0100307 | A1 | 5/2004 | Wong et al. |
| 2004/0140831 | A1 | 7/2004 | Wang |
| 2004/0227573 | A1 | 11/2004 | Soda |
| 2004/0233183 | A1 * | 11/2004 | Saeki ...................... 345/204 |
| 2006/0077003 | A1 * | 4/2006 | Chiu et al. ................. 330/9 |
| 2006/0186954 | A1 * | 8/2006 | Koller et al. .............. 330/9 |

OTHER PUBLICATIONS

Eduard Sackinger, "Broadband Circuits for Optical Fiber Communication," E-book published May 2005, Publisher: John Wiley & Sons, 2 page excerpt.

Office Action received for U.S. Appl. No. 11/421,675 dated Sep. 25, 2007.

Office Action received for U.S. Appl. No. 11/420,098 dated Oct. 4, 2007.

Jinghong Chen et al., Agere Systems, Allentown, PA and Jenshan Lin, Dept. of Electrical Engineering, University of Florida, Gainesville, FL, "Electrical Backplane Equalization Using Programmable Analog Zeros and Folded Active Inductors," 0-7803-9197-7/05 © 2005 IEEE, pp. 1366-1369.

* cited by examiner

10

50

ANALOG AMPLIFIER HAVING DC OFFSET CANCELLATION CIRCUIT AND METHOD OF OFFSET CANCELLATION FOR ANALOG AMPLIFIERS

CROSS-REFERENCE TO RELATED APPLICATION

This application claims priority to U.S. Provisional Patent Application Ser. No. 60/698,375 filed Jul. 12, 2005 and entitled "Electrical Backplane Equalization Using Programmable Analog Zeros And Folded Active Inductors", the entirety of which is hereby incorporated by reference herein.

FIELD OF THE INVENTION

The present invention relates generally to analog amplifiers and more particularly to offset cancellation schemes for analog amplifiers.

BACKGROUND OF THE INVENTION

Differential amplifiers typically have a built-in or internal DC offset due to device mismatch and parameter variations caused by manufacturing variations, as will be understood by those in the art. This offset causes asymmetry or mismatching of the amplifier components. Of particular note, the DC offset produces mismatch in the common mode voltages of the differential outputs of the amplifier. The input-referred offset voltage of an amplifier is the differential voltage required to be applied at the input of the amplifier to produce a null output. Many applications require the cancellation/minimization of the offset voltage. For example, a limiting amplifier used in broadband optical communications often requires the offset voltage to be around 0.1 mV or less. When the offset voltage is higher, the decision circuit will slice the data at a non-optimal level which leads to a sensitivity reduction and thus a poor bit-error-rate performance. A typical single stage BJT amplifier has a 3σ random offset of a few millivolts. A RF MOS amplifier typically has an offset voltage of a few 10 millivolts. The offset is much larger for multiple stage amplifiers. Therefore, offset cancellation schemes are employed to reduce the inherent offset to the desired level.

FIG. 1 is a circuit diagram of a prior art analog amplifier circuit 10 having offset cancellation. The circuit 10 includes a main operational amplifier 12 having positive and negative inputs and positive and negative outputs. The differential input voltage signal ($V_{IP}$ and $V_{IN}$) at the inputs is AC coupled through a pair of capacitors to the main amplifier 12. A differential output signal ($V_{ON}$ and $V_{OP}$) is provided at the output nodes. The input capacitors are relatively large and are designed to remove the common mode DC component from the input data signal. The circuit 10 also includes an error operational amplifier 14 and two low-pass RC filters coupled between the outputs of the main amplifier 12 and the inputs of the error amplifier 14. The error amplifier 14 supplies a differential DC input voltage to the input of main amplifier 12 to compensate for the main amplifier's offset voltage. The error amplifier 14 senses the DC component from the main amplifier's output signal using the two low-pass RC filters and adjusts its output voltage until the main amplifier's differential output voltage is compensated. The output impedance of the error amplifier 14 together with the 50Ω output resistors serve as the input termination of the main amplifier 12.

There are two reasons why the circuit 10 does not completely eliminate the offset voltage: (i) the finite gain of the error amplifier 14 and (ii) the offset voltage $V_{OS1}$ of the error amplifier. A simple analysis shows that the main amplifier 14 offset voltage is reduced to:

$$V'_{OS} = \frac{V_{OS} + A_1 V_{OS1}}{A \times A_1 + 1} \approx \frac{V_{OS}}{A \times A_1} + \frac{V_{OS1}}{A} \quad (1)$$

Since the error amplifier 14 does not have to be fast, large transistors with good matching properties can be used to make $V_{OS1}$ very small. Depending on the amount of the offset that must be removed, the gain of the error amplifier 14 $A_1$ can be a buffer ($A_1$=1) or an amplifier ($A_1$>1). Typically, a buffer is sufficient for a BJT amplifier while MOS amplifiers require additional loop-gain to meet the offset cancellation.

The offset-compensation circuit of FIG. 1 does not only suppress the offset voltage, but also the low-frequency components of the input signal. This undesired effect leads to a low frequency cutoff in the main amplifier 12's frequency response. The 3-dB low-frequency cutoff due to the offset compensation is $$f_{LF} = \frac{1}{2\pi} \frac{A \times A_1/2 + 1}{R \times C} \quad (2)$$

From this equation, it can be seen that in order to get a low cutoff frequency, we need to make the loop bandwidth 1/(2π× RC) much smaller. For example, if A×$A_1$/2=100, we need a loop bandwidth of 10 kHz to achieve a cutoff frequency of 1 MHz in the main amplifier 12. As a result, the resistance and capacitance used in the RC network are usually very large, occupying excessive and often unacceptable amounts of chip area.

SUMMARY OF THE INVENTION

An amplifier having DC offset compensation is provided. The amplifier includes at least one input node and a pair of differential output nodes, a biasing circuit coupled to the input node; and a plurality of current sources. Selected ones of the current sources are coupled to the input node to adjust a DC voltage at the input node to provide DC offset compensation for the amplifier.

A system and method for calibrating the amplifier are also provided.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

Figure 2:
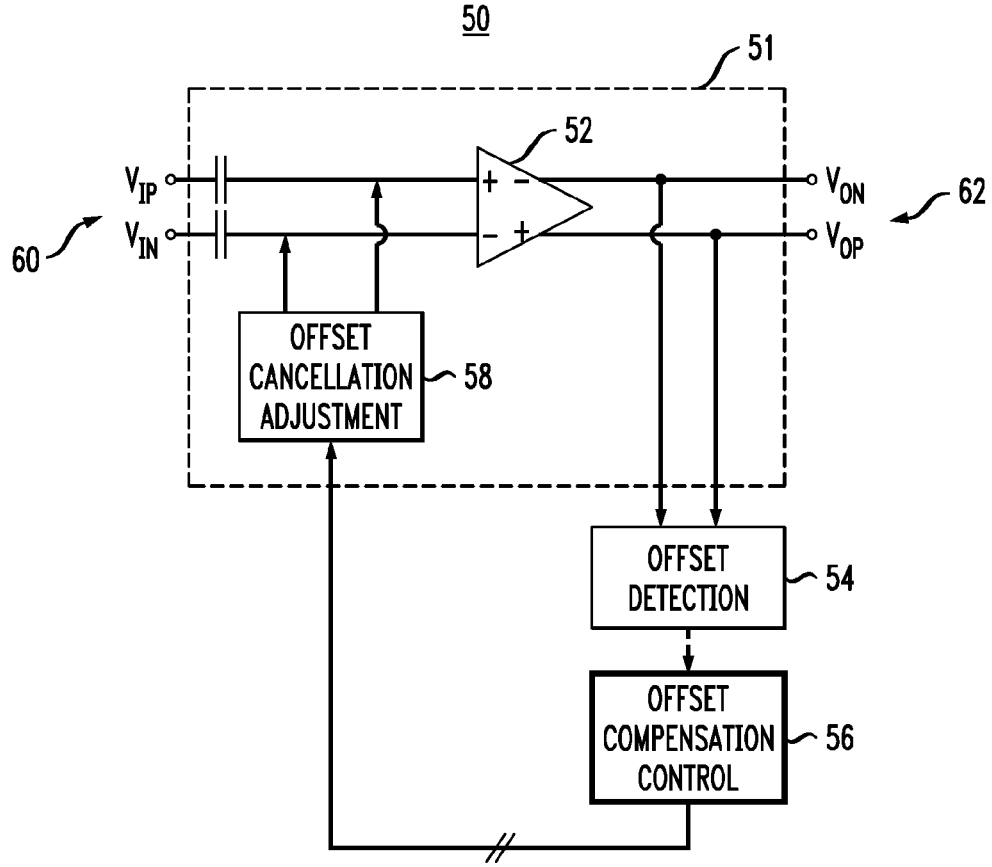
FIG. 2 is a block diagram of system for providing offset cancellation for an analog amplifier.

FIG. 2 is a block diagram of a system 50 for detecting and compensation for DC offset in an analog amplifier. The system includes an analog amplifier 51 having offset cancellation adjustment circuitry 58, an offset detection module 54 and an offset compensation control module 56. In one embodiment, the components shown within shadow box 51 are integrated on a single chip or substrate to form an amplifier, while offset detection module and offset compensation control modules 54, 56 are used for calibration of the amplifier 51 as described below in more detail. Though shown as separate components, offset detection module 54 and/or offset compensation control module 56 may be integrated into a chip or substrate with amplifier 51 to form a feedback loop in a self-calibrating amplifier. In one embodiment, only offset detection module 54 is integrated with amplifier device 51.

The amplifier device 51 of FIG. 2 includes inputs for receiving an input data signal 60. The input data signal 60 is amplified by an amplifier circuit, such as an operational amplifier 52, into an output data signal 62. In FIG. 2, input data signal 60 is a differential signal having a positive component $V_{IP}$ and a negative component $V_{IN}$, and output data signal 62 is a differential signal $V_{ON}$ and $V_{OP}$. The input signal may be AC coupled to amplifier 52 through a pair of blocking capacitors. Amplifier device 51 may be designed to accommodate a single-ended input data signal where one of the two differential inputs is left "floating" with no input.

Amplifier device 51 also includes an offset cancellation adjustment module 58. The offset cancellation adjustment module 58 is responsive to a control signal issued from offset compensation control module 56. Offset detection module 54 detects the inherent offset within the amplifier 52. For sake of brevity, FIG. 2 does not show additional amplifier stages within amplifier device 51, which may be employed in some embodiments. Such additional amplifier stages can be designed and implemented in accordance with conventional techniques.

Figure 2A:
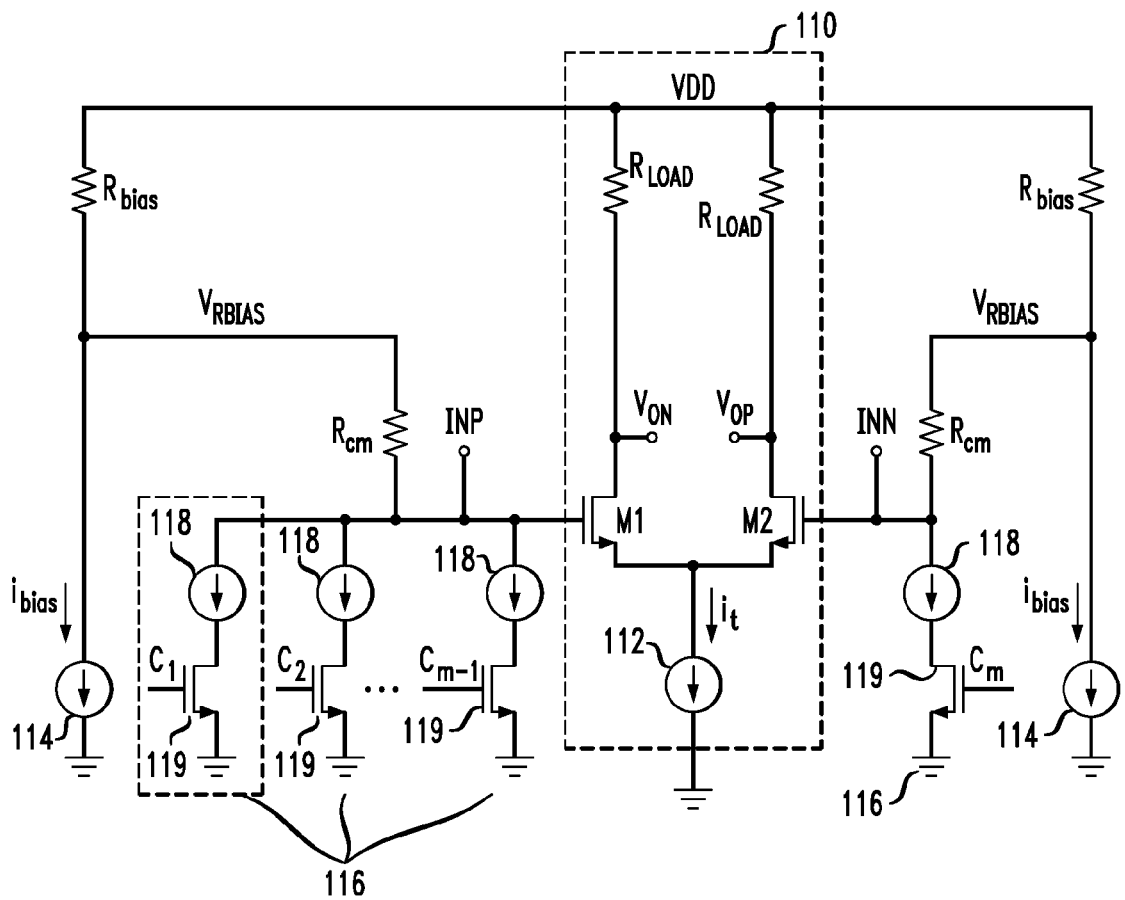
FIG. 2A is a circuit diagram of an analog amplifier with offset cancellation voltage adjustment circuitry according to an embodiment of the present invention.

FIG. 2A is a circuit diagram of an analog amplifier 100 having offset cancellation (also sometimes referred to as "offset compensation") adjustment circuitry according to an embodiment of the present invention. As used herein, "cancellation" does not require full removal of any DC offset but merely refers to compensation of the DC offset to within acceptable limits. In the illustrated embodiment, the amplifier 100 includes a MOS differential amplifier 110 having differential input nodes "INP" and "INN" for receiving input signals $V_{IP}$ and $V_{IN}$. Although an amplifier 110 is shown using MOSFET transistors, equivalent amplifier circuits may be configured for operation with other transistor types (e.g., BJT) and/or with other suitable active devices or switches.

The differential amplifier 110 includes a pair of load resistors ($R_{LOAD}$) coupled between power supply node VDD and differential output nodes $V_{ON}$ and $V_{OP}$. The amplifier 110 include differential input MOS transistors M1 and M2 coupled between the output nodes and a tail current source 112 for providing tail current $i_t$. Tail current source 112 typically includes a MOS transistor operating in saturation mode. Those skilled in the art are familiar with the operation of the differential amplifier 110, which is repeated herein. The tail current $i_t$ and resistance value of $R_{LOAD}$ are selected to set the common mode voltage of the amplifier to a desired voltage level. In one embodiment, VDD is 1.0 volt, the load resistance is 100Ω and the common mode voltage is set to 0.8V.

Figure 1:
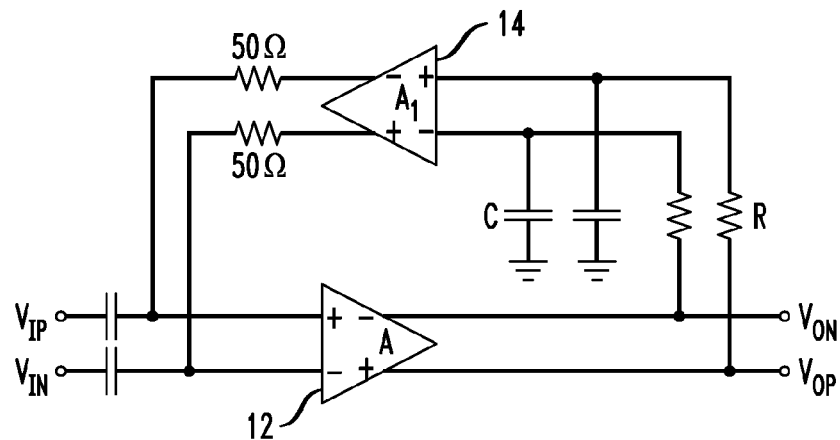
FIG. 1 is a circuit diagram of a prior art analog amplifier with offset cancellation.

The offset cancellation of FIG. 2A is performed by way of selectable adjustment circuitry rather than by the area consuming low pass filter/error amplifier circuitry discussed above in connection with FIG. 1. The adjustment circuitry includes bias resistors Rbias and current sources 114 for providing current $i_{bias}$ for setting the voltage at nodes $V_{RBIAS}$ to a default voltage level, i.e., to VDD−Rbias*$i_{bias}$. This default voltage level is the DC input to inputs INN and INP if no offset compensation is provided, as described below.

Voltage adjustment circuits 116 are coupled to differential input nodes INP and INN. In one embodiment, each adjustment circuit 116 includes a current source 118 coupled to the differential input node INN or INP and a switching transistor 119 coupled between the current source 118 and a ground node. In one embodiment, current sources 118 each comprise a MOS transistor. In the illustrated embodiment, "m" number of switching adjustment circuits 116 are provided responsive to control signals C1 to Cm as described below in more detail.

In one exemplary embodiment, the current from current sources 118 are binary weighted. Assume, by way of example, that m=4, i.e., that there are four switching adjustment circuits 116. In this embodiment, three adjustment circuits 116 are coupled to node INP and one adjustment circuit is coupled to node INN. The three current sources 118 coupled to node INP are designed to provide current drops across resistor $R_{CM}$ of 1 mV, 2 mV and 4 mV, thereby reducing the actual DC input voltage to input node INP from the default voltage $V_{RBIAS}$. The lone current source 118 coupled to node INN is designed to provide a current drop of 8 mV across resistor $R_{CM}$. Assuming these design parameters, different combinations of control signals C1, C2 and C3 provide different voltages at node INP as follows:

| C1 | C2 | C3 | Voltage at INP |
| --- | --- | --- | --- |
| 1 | 0 | 0 | $V_{RBIAS}$ − 1 mV |
| 0 | 1 | 0 | $V_{RBIAS}$ − 2 mV |
| 1 | 1 | 0 | $V_{RBIAS}$ − 3 mV |
| 0 | 0 | 1 | $V_{RBIAS}$ − 4 mV |
| 1 | 0 | 1 | $V_{RBIAS}$ − 5 mV |
| 0 | 1 | 1 | $V_{RBIAS}$ − 6 mV |
| 1 | 1 | 1 | $V_{RBIAS}$ − 7 mV |

Ideally, it is desired that the DC level of output $V_{ON}$ equals the DC output of $V_{OP}$, i.e., there is no offset, however, as explained above, there typically will be some offset due to process variations. In a first instance, assume that $V_{ON} > V_{OP}$ due to the offset voltage. In this situation, the input voltage at INP needs to be lowered to reduce the offset to an acceptable level, if not 0V. C1 is initially triggered to lower the voltage at INP by 1 mV. The offset is then checked and if 1 mV is not enough, then C1 can be turned off and C2 triggered to lower the voltage at INP by 2 mV. The offset is then checked again. Combinations of C1, C2 and C3 are tried until the offset is compensated.

On the other hand, assume the offset causes $V_{ON} < V_{OP}$, for example by 2 mV. Since $V_{ON} < V_{OP}$, C4 is turned on to lower INN by 8 mV. After C4 is triggered, INP will be 6 mV higher than the adjusted INN value. Signals C1, C2 and C3 are then selectively triggered as described above to lower INP by 6 mV until INP substantially equals INN, i.e., until any offset is within acceptable tolerances.

The following chart summarizes the voltage offset under various combinations.

| C1 | C2 | C3 | C4 | Voltage compensation |
|----|----|----|----|---------------------|
| 1 | 0 | 0 | 0 | −1 mV |
| 0 | 1 | 0 | 0 | −2 mV |
| 1 | 1 | 0 | 0 | −3 mV |
| 0 | 0 | 1 | 0 | −4 mV |
| 1 | 0 | 1 | 0 | −5 mV |
| 0 | 1 | 1 | 0 | −6 mV |
| 1 | 1 | 1 | 0 | −7 mV |
| 0 | 0 | 0 | 1 | +8 mV |
| 1 | 0 | 0 | 1 | +7 mV |
| 0 | 1 | 0 | 1 | +6 mV |
| 1 | 1 | 0 | 1 | +5 mV |
| 0 | 0 | 1 | 1 | +4 mV |
| 1 | 0 | 1 | 1 | +3 mV |
| 0 | 1 | 1 | 1 | +2 mV |
| 1 | 1 | 1 | 1 | +1 mV |

Other design approaches may be utilized for adjusting the voltages at INN and INP. For example, the current values need not be binary weighted. In this embodiment, the current value from the current source coupled to INN could be selected to provide a voltage at node INN of 8 mV and eight equally valued current sources for providing a 1 mv voltage drop could be coupled to INP. Current sources could then be incrementally triggered until the offset is compensated. Likewise, multiple selectable current sources may be provided coupled to both INP and INN, or a single current selectable current source could be coupled to INP and multiple selectable current sources coupled to node INN. Further, individual current sources could be coupled to either INN or INP by a pair of switches, so that the current source could be coupled to one, both or neither node as needed.

Nonetheless, the configuration shown in FIG. 2A is preferred as it provides size advantages. By binary weighting the current sources, multiple voltage combinations and relationships between INP and INN can be accomplished with a minimum number of current sources, and thus at reduced circuit complexity and chip area.

As should be understood, the increments in voltage drops across resistors $R_{CM}$ and the number of adjustment circuits can be readily selected to achieve a desired offset tolerance, within a given expected range of offsets. The embodiment described above, with m=4 and with the incremental voltage adjustments equal to 1 mV, can be used as long as the maximum expected offset is 8 mV and the maximum acceptable offset tolerance is 1 mV. If the maximum expected offset were 8 mV and the maximum acceptable offset tolerance were 0.5V, then m could be set to 5 and the incremental voltage adjustments set to 0.5 mV, for example. It should be apparent that the preferred binary weighted circuit design requires only one additional current source to implement these 16, as opposed to 8 (when m=4), offset compensation combinations.

For an amplifier designed in a deep submicron CMOS technology (for example a 90 nm CMOS technology), typical VDD is 1.0V. If Ibias=0.1 mA, then Rbias can be set at 2K to give a Vrbias=VDD−Ibias×Rbias=0.8V. If the maximum acceptable offset tolerance is 1 mV, then Rcm can be set at 10K, and the current source controlled by switch C1 can be set at 0.1 μA. Note that for the exemplary embodiment 0.1 μA×10K gives a maximum acceptable offset tolerance of 1 mV. The maximum acceptable offset tolerance of the amplifier is often determined by the particular applications. In optical applications where the received signal (e.g., the signal at the amplifier input nodes INN and INP) is small, a 0.1 mV or less maximum acceptable offset tolerance is often desired. On the other hand, in chip-to-chip communications where the received signal is large, a larger maximum acceptable offset tolerance (such as 1 mV) can be used.

An exemplary circuit is now described for providing control signals C1:Cm for triggering switches 119 for selectively connecting current sources 118 to nodes INN and INP, specifically for implementing offset compensation control and offset detection modules 56, 54.

Figure 3:
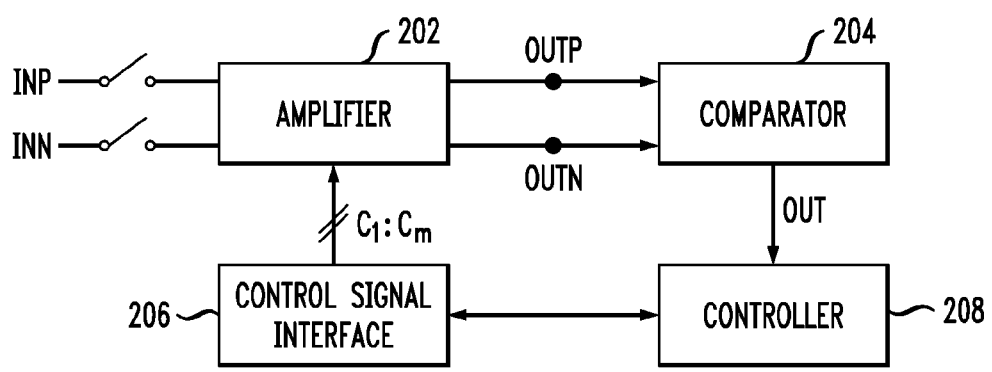
FIG. 3 is a block diagram of a system for determining offset cancellation in an analog amplifier.

As shown in the calibration system 200 of FIG. 3, the inputs to the amplifier 202 are disconnected by opening switches to isolate the amplifier 202 from external signal sources. The outputs (OUTP and OUTN) are coupled to a comparator 204. An offset compensation control signal interface 206 is coupled to the amplifier circuit to provide control signals C1:Cm. In one embodiment, the offset compensation control signal interface 206 includes an interface such as a serial I/O digital data bus for providing the control signals. Comparator 204 can be coupled to a microcontroller or digital counter 208 for monitoring the comparator output and directing the provision of control signals through interface 206.

Though the amplifier is isolated, the amplifier itself has an inherent DC offset, meaning OUTP may not be equal to OUTN. The amplifier output is sent to comparator 204 and if OUTP>OUTN, the comparator 204 outputs a logic "1" or high. Otherwise, if OUTP<OUTN, the comparator output is a logic "0" or low. If the output is "1," then it is known that INP>INN. Conversely, if the output is "0," then it is known then INP<INN.

It should be noted that in designing the comparator, the comparator itself should not introduce a significant amount of offset. Unlike the amplifier which often needs to operate at high frequencies, the comparator only needs to operate at a very low frequency, e.g., 3-dB bandwidth of several kHz. As a result, large transistors (e.g., the channel length of the input transistor of the comparator can be large) with good matching properties can be used to make the offset of the comparator very small/negligible. Designs for such comparators are well know in the art. In embodiments, the comparator is integrated into the amplifier integrated circuit and the comparator output is monitored by external microcontroller 208 or an on-chip microprocessor.

An exemplary procedure for calibrating the amplifier is described below. An amplifier as described herein is often used in, for example, a high-speed backplane serializer deserializer (SERDES) system, high-speed optical receiver, etc. In these applications, the entire system typically will undergo a one-time calibration. During the calibration process, the amplifier offset is calibrated out and the control signals C1:Cm are determined and set. Though not shown, signals C1:Cm for turning on/off switching devices 119 can be permanently set (e.g., connected, disconnected to an appropriate voltage for triggering device 119) by blowing switches (not shown) as will be familiar to those in the art. Alternatively, if the amplifier IC has an on-chip processor, the control signals can be programmed into a memory accessible to the processor for use during operation of the amplifier.

Figure 4:
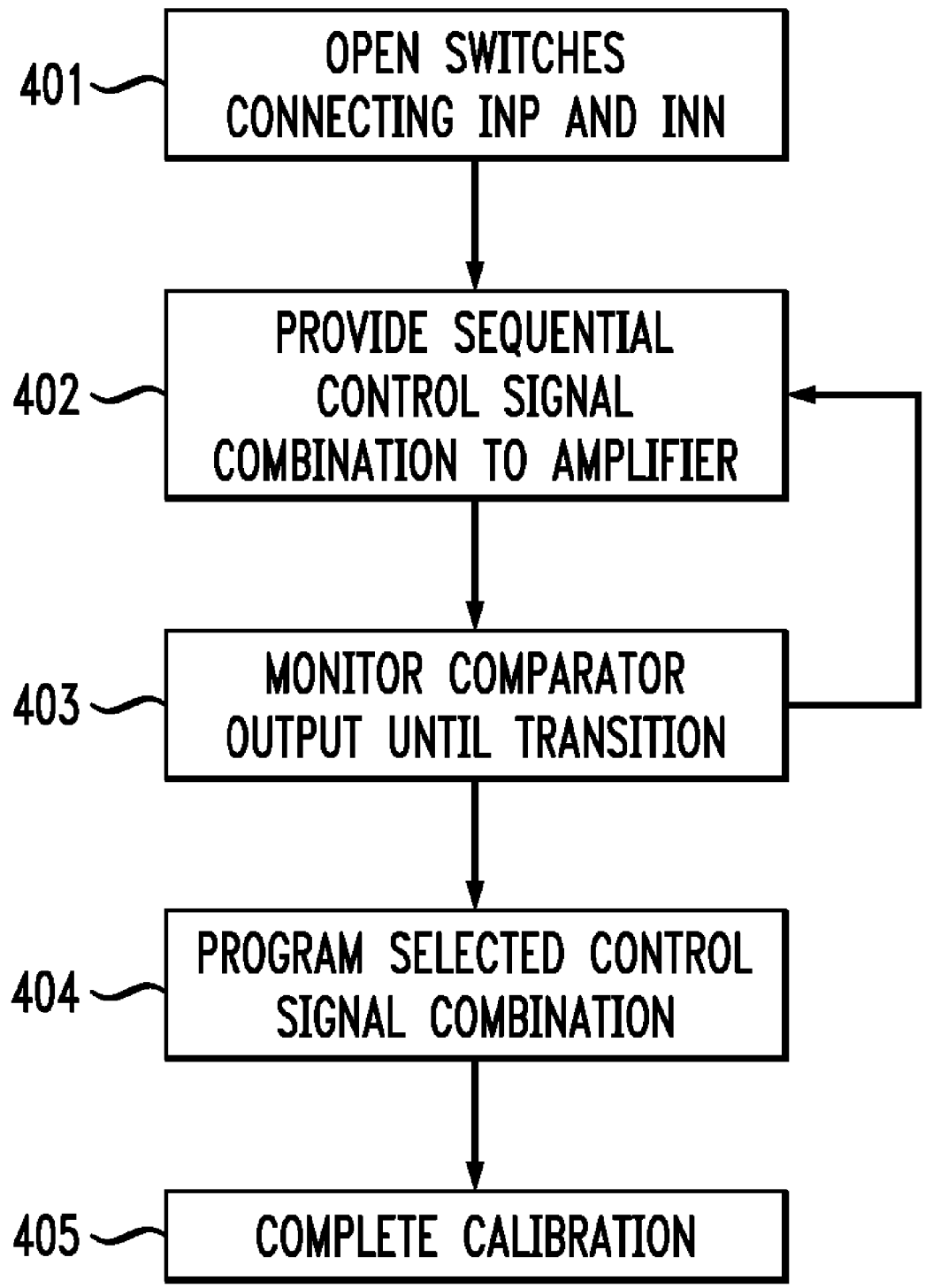
FIG. 4 is a flow diagram for an exemplary method of calibrating procedure.

With reference to FIG. 4, in an embodiment, the calibration procedure is as follows:
 (a) open switches connecting INP and INN to isolate the amplifier from outside inputs (step 401);
 (b) provide sequential control signal (C1:Cm) combinations to amplifier, (step 402);
 (c) monitor the comparator output using on-chip processor or external microcontroller or digital counter and repeat (b), until at, a certain C1:Cm combination, it is observed/detected that the comparator output transitions from "1" to "0" or vice versa (step 403);

(d) permanently program the last C1:Cm combination (or combination immediately preceding a change in comparator output) into the amplifier IC (step 404); and (e) close switches to couple nodes INP and INN to the external inputs and complete calibration of the other elements of the amplifier system as needed (step 405).

The amplifier described herein can be used in any number of applications, and particularly in telecommunication and data communication systems. In one exemplary use, the amplifier is used in connection with optical detection circuitry to amplify the detected voltage from an optical fiber channel. In another exemplary embodiment, the amplifier is used as an amplifier in a DSL (digital subscriber line) system.

Figure 2B:
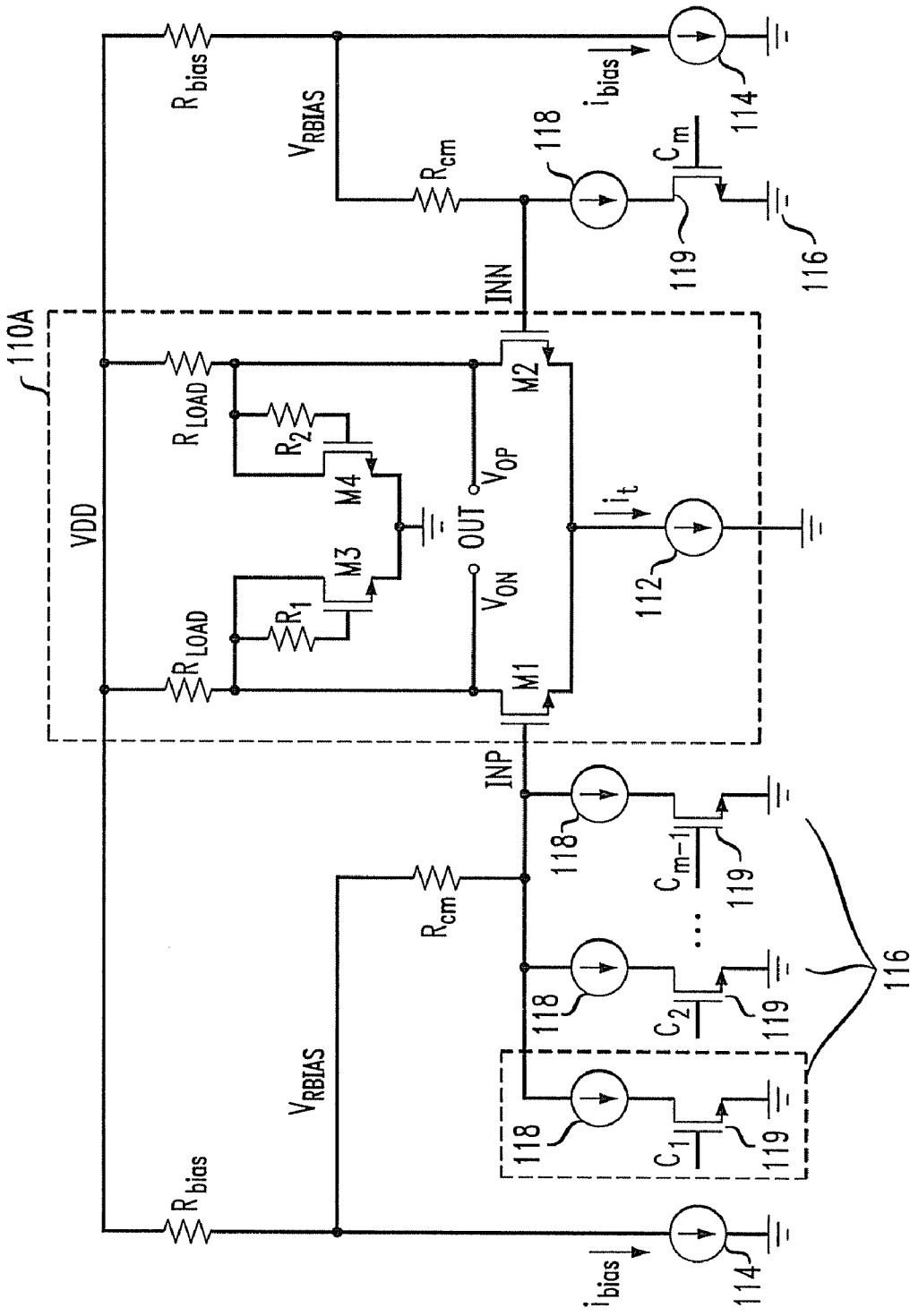
FIG. 2B is a circuit diagram of an alternative embodiment of the analog amplifier of FIG. 2A with a folded active inductor load.

FIG. 2B is an alternative embodiment of the amplifier circuit with offset voltage cancellation circuitry of FIG. 2A. The amplifier of FIG. 2B is identical in all respects to the amplifier circuit of FIG. 2A only the amplifier 110A includes an improved load having a folded active inductor load coupled to each output node $V_{ON}$ and $V_{op}$. The load includes pull up resistors $R_{LOAD}$ and $R_{LOAD}$ coupled between supply rail VDD and the output nodes. A pair of folded active inductors is coupled to the output nodes. Each folded active inductor comprises a resistor R1 or R2 and a NMOS transistor M3 or M4. Resistors R1 and R2 are coupled between pull up resistors $R_{LOAD}$, $R_{LOAD}$ and the gate nodes of NMOS transistors M3 and M3, respectively. The drain terminals of M3 and M4 are also coupled to pull up resistors $R_{LOAD}$, $R_{LOAD}$, respectively. The common source nodes of transistors M3 and M4 are coupled to constant current source 112, which preferably comprises a NMOS transistor. The common current source is coupled to VSS.

The signal behavior/model for the folded active inductor load is briefly discussed herein and detailed model development is provided in Jinghong Chen, et al. "Electrical Backplane Equalization Using Programmable Analog Zeros and Folded Active Inductors," the entirety of which is hereby incorporated by reference herein (Pages: 1366-1369, 48$^{th}$ IEEE Midwest Symposium on Circuits and Systems, Aug. 7-10, 2005). The impedance of the folded active inductor can be calculated as:

$$Z_{in} = R_{load} // \left(R_f + \frac{1}{sC_{gs}}\right) // \frac{1}{g_m \frac{sC_{gs}}{R_f + \frac{1}{sC_{gs}}}} = \qquad (1)$$

$$Z_{in} \approx R_{load} // \frac{1}{g_m} \frac{1 + sC_{gs}R_f}{1 + sC_{gs}\frac{1}{g_m}}$$

In EQ. (1), $g_m$ denotes the small-signal trans-conductance of transistors M3 and M4, $R_{load}$ denotes the resistance value of resistors $R_{LOAD}$, $R_{LOAD}$, and $R_f$ denotes the resistance value of resistors R1 and R2. The impedance $Z_{in}$ provides a zero and a pole and has an inductor characteristic. At low frequency $Z_{in} \approx R_{load}//1/g_m$; at high frequency $Z_{in} \approx R_{load}//R_f$.

The parasitic capacitances (e.g., capacitance inherent in CML logic circuits and metal routing capacitance) as well as loading capacitance (e.g., next stage load capacitance) at the output node are denoted as $C_{load}$. Then, considering $C_{load}$, the output impedance of the CML multiplexer circuit shown in FIG. 4 becomes:

$$Z_{in} = R_{load} // \left(R_f + \frac{1}{sC_{gs}}\right) // \frac{1}{g_m \frac{sC_{gs}}{R_f + \frac{1}{sC_{gs}}}} // \frac{1}{sC_{load}} \qquad (2)$$

The transfer function of $Z_{in}$ now has one zero and two poles—zero1 and pole1 from the added folded active inductor, and pole2 due to $C_{load}$. The goal of the folded-active-inductor load is to provide the zero (e.g., zero1) in the $Z_{in}$ transfer function to alter the effect of the pole due to $C_{load}$ (e.g., pole2 ). In the folded active inductor load shown in FIG. 2B, the trans-conductance of the transistors M3 and M4 (e.g., the transistor size of M3 and M4 and the current of tail current source 112) and the resistance value of resistors R1 and R2 are designed so that zero1 can be equal to pole2 as is graphically shown in FIG. 6. Doing so extends the circuit bandwidth, thus enabling the CML circuit to operate at a higher speed. With zero1 canceling out pole2, the CML circuit with the folded active inductor load now has a pole at pole1 which is much large than pole2 (e.g., a higher bandwidth thus a higher operation speed).

A low power small area electrical backplane equalizer using programmable analog zeros and folded active inductors was implemented in a 1.0V Taiwan Semiconductor Manufacturing Company (TSMC) 90 nm CMOS process. With one zero stage, the equalizer occupies only 0.015 mm$^2$ chip area and dissipates 8 mW of power. At 3.125 Gb/s data rate, lab measurement shows that the equalizer provides 6.5 dB gain boost at the baud-rate frequency. Without the use of any transmitter equalization, the analog equalizer opens the received eye which is almost closed and demonstrates error-free transmission for a PRBS-31 data pattern over a 34 inches FR4 backplane.

Figure 5:
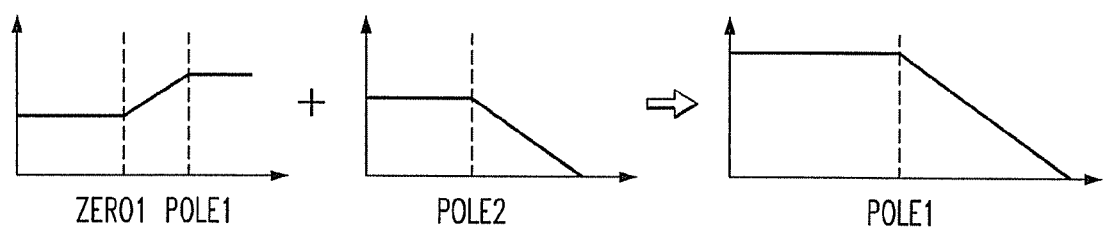
FIG. 5 graphically illustrates pole-zero cancellation of a folded active inductor shunting peaking load.

Referring again to FIG. 5, the folded active inductor introduces a zero which cancels out the pole due to the capacitance (the inherent parasitic capacitance as well as the loading capacitance) at the CML circuit output node. Such a pole-zero cancellation extends the bandwidth of the CML circuit enabling the circuit to operate at higher speeds.

The load including folded active inductors helps to improve the switching speed of the CML circuit by offsetting parasitic capacitances in the circuit. Large voltages can be provided across the gate and source of the NMOS transistors in the folded active inductor loads without causing headroom problems associated with conventional active inductors. The common-mode voltage is also well maintained as it is not dependent upon the gate-to-source dc voltage drop across load transistors, which may vary PVTs. The entire circuit can also be operated with a 1.0V supply without the need for any high voltage generation circuit. The folded active inductor, therefore, not only consumes lower voltage headroom but also is area-efficient, compared to the conventional active and on-chip inductors, respectively.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. An amplifier having DC offset compensation, said amplifier comprising:
   a pair of differential input nodes and a pair of differential output nodes;
   first and second biasing circuits coupled to said input nodes; and
   a plurality of binary weighted selectable current sources, said plurality of binary weighted selectable current sources comprising a first group of selectable current sources associated with a first one of said differential input nodes comprising at least one selectable current source and a second group of selectable current sources associated with a second one of said differential input nodes comprising at least one selectable current source, wherein selected ones of said current sources are coupled to said input nodes to adjust a respective DC voltage at each of said input nodes to simultaneously provide DC offset compensation for said amplifier.

2. The amplifier of claim 1, further comprising an offset detection circuit coupled to said output nodes and having an offset detection output, wherein said offset detection circuit comprises a comparator.

3. The amplifier of claim 2, wherein said amplifier is fabricated on an integrated circuit chip.

4. The amplifier of claim 1, wherein at least one of said selectable current sources comprises a constant current source coupled in series with a switch.

5. The amplifier of claim 1, wherein the first group of selectable current sources comprises a plurality of binary weighted current sources and the second group of selectable current sources comprises a current source binary weighted with respect to the current sources of the first group, wherein the current source of the second group has a weighting greater than the sum of the weighting of the current sources in the first group.

6. The amplifier of claim 1, wherein each biasing circuit comprises:
   a first resistive element coupled as a bias resistive element between a power supply node and a respective intermediate node;
   a bias current source coupled between said intermediate node and a ground node; and
   a second resistive element coupled between said intermediate node and a respective input node,
   wherein said current sources from said plurality of current sources are coupled between said input node and said ground node.

7. An amplifier having DC offset compensation, said amplifier comprising:
   a pair of differential input nodes and a pair of differential output nodes;
   a biasing circuit coupled to said input nodes, said biasing circuit providing a positive default bias at said inputs nodes; and
   means for simultaneously adjusting a DC voltage at each of said input nodes from said positive default bias to provide DC offset compensation for said amplifier in accordance with a programmed DC offset.

8. A calibration system for an amplifier having a DC offset, said amplifier comprising at least one input node, a pair of differential output nodes and an offset compensation adjustment circuit responsive to a control signal to adjust a DC voltage at said input to provide DC offset compensation for said amplifier, wherein said offset compensation adjustment circuit comprises a plurality of selectable current sources, selected ones of said current sources being selected for coupling to said input node of said amplifier by said control signal to adjust said DC voltage at said input to provide said DC offset compensation for said amplifier, said system comprising:
   an offset detection module having a pair of inputs corresponding to said output nodes, said offset detection module providing an offset detection output representative of said DC offset; and
   an offset compensation control module for providing the control signal to said offset compensation adjustment circuit for adjusting said DC offset, wherein said amplifier is formed in an integrated circuit and said offset compensation control module is external to said integrated circuit, wherein the control signal programs the DC offset into said integrated circuit.

9. The calibration system of claim 8, wherein said offset detection module comprises a comparator integrated with said amplifier.

10. The calibration system of claim 8, wherein said offset compensation control module includes a transfer interface for coupling said external offset compensation control module to said integrated circuit for providing said control signal.

11. A method of compensation for DC offset in an amplifier, said amplifier comprising a pair of differential input nodes and a pair of differential output nodes, comprising the steps of:
   selectively coupling a plurality of current sources simultaneously to said input nodes in a combination that adjusts a DC voltage at said input nodes to provide DC offset compensation for said amplifier.

12. The method of claim 11, wherein said method further comprises the step of determining a DC offset level for said amplifier.

13. The method of claim 12, wherein said determining step comprises:
   coupling a comparator to said outputs of said amplifier;
   providing control signals to said amplifier corresponding to a plurality of different combinations of said current sources; and
   monitoring an output of said comparator.

14. The method of claim 11, wherein said current sources are binary weighted.

* * * * *